United States Patent [19]

Inoue et al.

[11] Patent Number: 5,639,299
[45] Date of Patent: Jun. 17, 1997

[54] METHOD OF MAKING COMPOUND SEMICONDUCTOR SINGLE-CRYSTALLINE SUBSTRATE FOR LIQUID PHASE EPITAXIAL GROWTH

[75] Inventors: Tetsuya Inoue; Makoto Otsuki; Tetsuichi Yokota, all of Hyogo, Japan

[73] Assignee: Sumitomo Electric Industries, Ltd., Osaka, Japan

[21] Appl. No.: 451,572

[22] Filed: May 26, 1995

Related U.S. Application Data

[62] Division of Ser. No. 400,271, Mar. 3, 1995, Pat. No. 5,514,903, which is a continuation of Ser. No. 204,059, Mar. 1, 1994, abandoned.

[30] Foreign Application Priority Data

Mar. 2, 1993 [JP] Japan ............................ 5-40336

[51] Int. Cl.⁶ .................................................. C30B 19/12
[52] U.S. Cl. ............................ 117/2; 117/58; 117/954
[58] Field of Search ............................ 117/2, 54, 55, 117/56, 58, 954

[56] References Cited

U.S. PATENT DOCUMENTS

| | | | |
|---|---|---|---|
| 3,877,052 | 4/1975 | Dixon et al. | 357/17 |
| 4,342,148 | 8/1982 | SpringThorpe et al. | 117/101 |
| 4,422,888 | 12/1983 | Stutius | 117/101 |
| 5,032,366 | 7/1991 | Finicle | 117/223 |
| 5,040,044 | 3/1991 | Noguchi et al. | 357/52 |
| 5,260,588 | 11/1993 | Ohta et al. | 257/93 |
| 5,346,581 | 9/1994 | Tsang | 117/97 |

FOREIGN PATENT DOCUMENTS 63-256600  10/1988  Japan .

*Primary Examiner*—Felisa Garrett
*Attorney, Agent, or Firm*—W. G. Fasse; W. F. Fasse

[57] ABSTRACT

The disclosed method of making a compound semiconductor single-crystalline substrate for liquid phase epitaxial growth has a relatively low cost and excellent practicality. The compound semiconductor single-crystalline substrate is prepared to have a surface roughness of at least 1 μm and not more than 10 μm as measured over a line of 1 mm length. This substrate is employed as a substrate for an epitaxial wafer for an infrared- or visible light-emitting diode. Due to its particular roughness, the substrate can be prevented from slipping or falling while it is transported during processing. Furthermore, no lapping and polishing are required for manufacturing the substrate. Thus, the substrate for liquid phase epitaxial growth can be provided at a relatively low cost.

19 Claims, 3 Drawing Sheets

METHOD OF MAKING COMPOUND SEMICONDUCTOR SINGLE-CRYSTALLINE SUBSTRATE FOR LIQUID PHASE EPITAXIAL GROWTH

CROSS-REFERENCE TO RELATED APPLICATIONS

This is a divisional of U.S. patent application Ser. No. 08/400,271, filed Mar. 3, 1995, which issued as U.S. Pat. No. 5,514,903 on May 7, 1996, and which was a File Wrapper Continuation of U.S. patent application Ser. No. 08/204,059, filed Mar. 1, 1994 and now abandoned.

FIELD OF THE INVENTION

The present invention relates to a method of making a compound semiconductor single-crystalline substrate which is employed for liquid phase epitaxial growth.

BACKGROUND INFORMATION

In general, according to the prior art the surface of a compound semiconductor substrate for epitaxial growth is polished into a mirror finished surface. The roughness of this surface is generally less than 1 µm as measured over each 1 mm line. Such a substrate having a mirror finished surface or a nearly mirror finished surface is obtained by slicing a single-crystalline ingot, thereafter rounding the as-obtained substrate as needed, lapping its surface, and polishing the same as needed. It has been common knowledge for those skilled in the art to finish the surface of such a substrate into a mirror finished surface or nearly mirror finished surface, in order to maintain important characteristics, such as flatness, uniformity in thickness and stability of electro-optical properties, of an epitaxial layer that is to be grown on the surface of the substrate.

While epitaxial growth is carried out by various methods such as vapor deposition, liquid phase epitaxy and molecular beam epitaxy, a substrate having a mirror finished surface or a surface which is nearly mirror finished is generally employed in every method. In fact, it can be said that there has been no idea of using a substrate having a rough surface to make a liquid phase epitaxial wafer for a light emitting diode.

Manufacturing such a conventional substrate having a mirror finished surface or a surface which is nearly mirror finished, however, requires much time and trouble as well as a high cost, due to the required slicing, lapping and polishing steps. Further, a GaAs substrate about 76 mm in diameter and 600 µm in thickness weighs about 14 g, and easily slips from holding tools and falls down during transportation if the substrate has a mirror finished surface.

SUMMARY OF THE INVENTION

In order to solve the aforementioned problems, an object of the present invention is to provide a very practical compound semiconductor single-crystalline substrate for liquid phase epitaxial growth, which has a relatively low cost and a reduced tendency to slip during transportation.

In the inventive compound semiconductor single-crystalline substrate for liquid phase epitaxial growth, the average value of surface roughness levels that are measured in a plurality of portions or areas on the substrate surface is within a range of at least 1 µm and not more than 20 µm, and preferably not more than 10 µm.

Further according to the invention, at least 50% of a plurality of surface roughness values measured on the substrate surface one in by one every region of about 1 cm² in surface area are within a range of at least 1 µm and not more than 20 µm, preferably at least 1 µm and not more than 10 µm. The term "surface roughness" means the difference between the maximum height and the minimum height that are measured on the surface in a region of about 1 cm² in surface area along a line 1 mm in length. The surface roughness is measured with a stylus having a radius of curvature of 1 to 50 µm in its forward end, which is in contact with the surface of the substrate.

Preferably, the substrate is prepared from a GaAs compound semiconductor. This substrate is employed as a substrate for an epitaxial wafer for an infrared- or visible light-emitting diode. Because the substrate has a particular surface roughness according to the invention, no lapping and polishing are required in manufacturing the substrate. Thus, it is possible to reduce the time and trouble which are required for manufacturing, so as to obtain the substrate at a relatively low cost. Further, the problem of the substrate slipping during transportation is also reduced, because the substrate has a rougher surface as compared with that having a mirror finished surface. The inventive semiconductor single-crystalline substrate is advantageously used for an epitaxial wafer for an infrared- or visible light-emitting diode, particularly in a GaAs single-crystalline substrate.

An epitaxial layer used for such a light emitting diode generally has a thickness of at least 10 µm. The inventors have found that the substrate crystal does not have to have a mirror finished surface or a nearly mirror finished surface for growing an epitaxial layer having such a thickness by liquid phase epitaxy. It is possible to effectively use the inventive substrate having the claimed surface roughness by setting proper conditions in liquid phase epitaxy. An epitaxial layer for an electronic device or the like that is grown by vapor deposition or molecular beam epitaxy has a thickness of less than 10 µm in general, whereby these types of epitaxy have a tendency to cause the irregularity of the substrate surface to be reflected onto the surface of the epitaxially grown layer in fidelity. Therefore, it is impossible to use a substrate having a rough surface for vapor deposition or molecular beam epitaxy.

When the surface roughness of the substrate is less than 1 µm, the substrate easily slips from holding tools and falls down during transportation. When the surface roughness of the substrate exceeds 20 µm, on the other hand, the occurrence of abnormality on the epitaxial layer grown on the surface of the substrate is abruptly increased.

When each individual measured surface area is less than 1 cm², it takes much time to measure the surface roughness over the entire substrate, whereby a high cost results due to the low productivity. When the measured surface area exceeds 1 cm², on the other hand, the measurements become less precise. It is preferable to measure a smaller total surface area so that the productivity may not deteriorate for evaluating the characteristics of the surface of substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

In order that the invention may be clearly understood, it will now be described, by way of example, with reference to the accompanying drawings, wherein.

DESCRIPTION OF PREFERRED EXAMPLE EMBODIMENTS AND OF THE BEST MODE OF THE INVENTION

EXAMPLE 1

Figure 1:
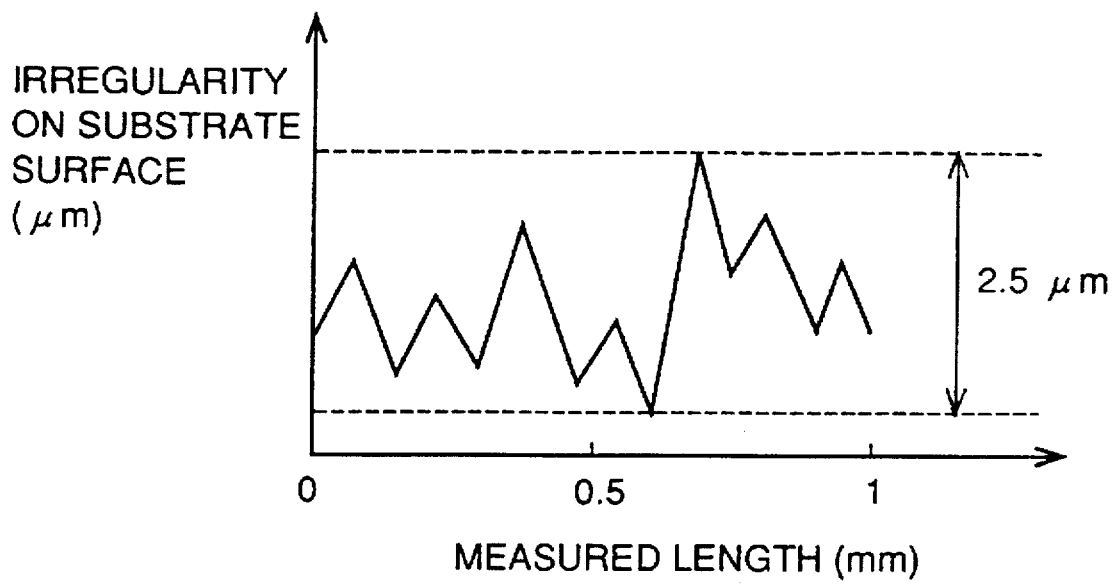
FIG. 1 is a graph showing an exemplary surface roughness of a compound semiconductor single-crystalline substrate according to the present invention.

A GaAs single-crystalline ingot, which was grown by a boat method, was sliced into wafers 530 μm in thickness. Each wafer was worked into a circle 76 mm in diameter, to obtain a substrate for liquid phase epitaxial growth. The slicer was prepared from an ordinary inner peripheral cutting edge grindstone on which diamond abrasive grains were electrodeposited. Respective parts of this slicer were improved in mechanical accuracy, while grain sizes and shapes of the diamond abrasive grains were optimized to improve surface roughness. After the slicing, the surface roughness of the wafer was measured, one by one for each area of about 1 cm², on a line 1 mm in length. The as-measured surface roughness levels were 1 to 4 μm in at least 50% of the measuring area or points. FIG. 1 shows an exemplary result of the as-measured surface roughness i.e. of 2.5 μm measured as the difference between the maximum height and the minimum height along a 1 mm long line in one area measuring 1 cm².

Figure 4:
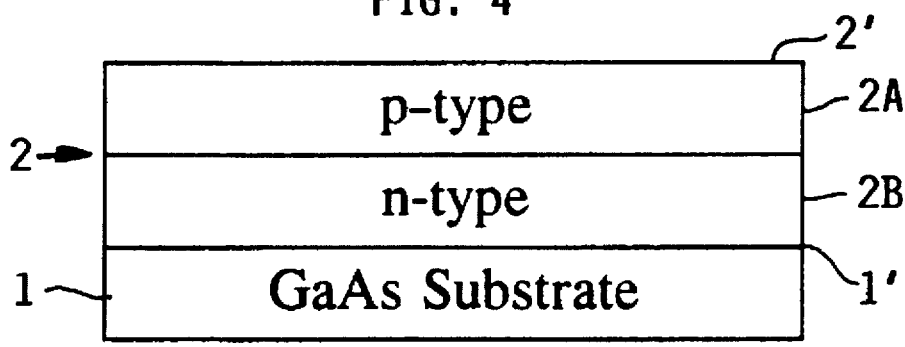
FIG. 4 is a schematic view of an infrared emitting diode prepared according to Example 1 of the invention.

As shown in FIG. 4, an Si-doped GaAs epitaxial layer 2 for an infrared-emitting diode was formed on this GaAs single-crystalline substrate by liquid phase epitaxy. The as-formed epitaxial layer 2 had a total thickness of 180 μm including those of p-type and n-type layers, 2A and 2B, respectively and uniformity of the thickness was within ±5% in the wafer plane and between such wafers. The surface 2' of the epitaxial layer 2 was in an excellent state with no abnormal growth etc. It is preferable to melt back the substrate surface 1', i.e., to partially dissolve the substrate surface 1 in a raw material solution before starting the epitaxial growth. It was found that it is possible to obtain an epitaxial layer having a flat surface with a uniform thickness by optimizing melt-back conditions. A light emitting diode which was prepared from this epitaxial wafer had excellent electrical and optical properties.

EXAMPLE 2

A GaAs single-crystalline ingot, which was grown by a boat method was sliced into wafers 370 μm in thickness. Each wafer was worked into a circle 50 mm in diameter, to obtain a substrate for liquid phase epitaxial growth. The slicer was prepared from an ordinary inner peripheral cutting edge grindstone on which diamond abrasive grains were electrodeposited. Respective parts of this slicer were improved in mechanical accuracy, while grain sizes and shades of the diamond abrasive grains were optimized to improve surface roughness. After the slicing, the surface roughness of the wafer was measured, one by one for each area of about 1 cm², on a line 1 mm in length. The as-measured surface roughness levels were 5 to 13 μm in at least 50% of the measuring areas of points.

Figure 5:
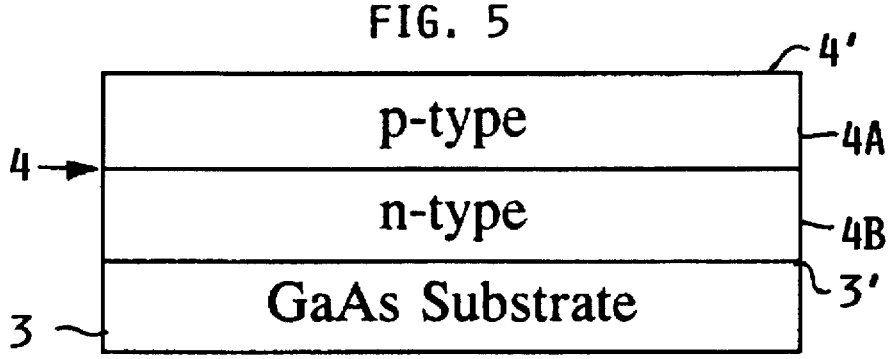
FIG. 5 is a schematic view of an infrared emitting diode prepared according to Example 2 of the invention.

As shown in FIG. 5, an Si-doped GaAs epitaxial layer 4 for an infrared-emitting diode was formed on this GaAs single-crystalline substrate 3 by liquid phase epitaxy. The as-formed epitaxial layer 4 had a total thickness of 180 μm including those of p-type and n-type layers, 4A and 4B, respectively and uniformity of the thickness was within ±5% in the wafer plane and between such wafers. The surface 4 of the epitaxial layer 4 was in an excellent state with no abnormal growth etc. in is preferable to melt back the substrate surface, 3' i.e., to partially dissolve the substrate surface 3 in a raw material solution before starting the epitaxial growth. It was found that it is possible to obtain an epitaxial layer having a flat surface with a uniform thickness by optimizing melt-back conditions. A light emitting diode which was prepared from this epitaxial wafer had excellent electrical and optical properties.

EXAMPLE 3

Figure 6:
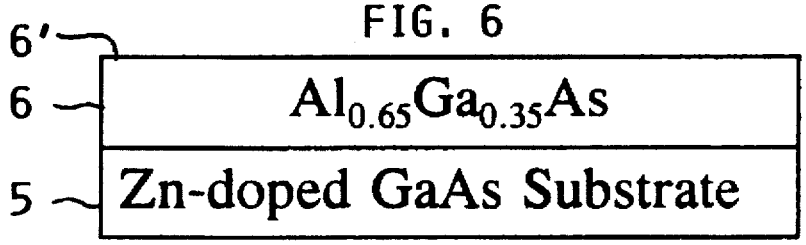
FIG. 6 is a schematic view of a Zn-doped GaAs substrate with an $Al_{0.65}Ga_{0.35}As$ epitaxial layer formed thereon by liquid phase epitaxy according to Example 3 of the invention.

A Zn-doped GaAs single-crystalline ingot, which was grown by a boat method, was sliced into wafers 600 μm in thickness. Each wafer was worked into a circle 76 mm in diameter, to obtain a substrate for liquid phase epitaxial growth. Surface roughness of the wafer was measured, one by one for each area of about 1 cm² on a line 1 mm in length. The as-measured surface roughness levels were 5 to 7 μm in at least 50% of the measuring area or points. As shown in FIG. 6 $Al_{0.65}Ga_{0.35}As$ epitaxial layer 6 of 10 μm thickness was formed on this substrate 5 by liquid phase epitaxy. Uniformity of the thickness of the as-formed epitaxial layer 6 was within ±3% in the wafer plane and between such wafers. The surface 6' of the epitaxial layer 6 was in an excellent state with no abnormal growth etc.

EXAMPLE 4

Figure 7:
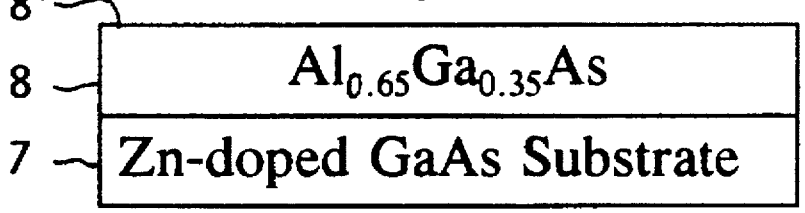
FIG. 7 is a schematic view of a Zn-doped GaAs substrate with an $Al_{0.65}Ga_{0.35}As$ epitaxial layer formed thereon by liquid phase epitaxy according to Example 4 of the invention.

A Zn-doped GaAs single-crystalline ingot, which was grown by a boat method, was sliced into wafers 370 μm in thickness. Each wafer was worked into a circle 50 mm in diameter, to obtain a substrate for liquid phase epitaxial growth. Surface roughness of the wafer was measured, one by one for each area of about 1 cm², on a line 1 mm in length. The as-measured surface roughness levels were 9 to 16 μm in at least 50% of the measuring area or points. As shown in FIG. 7, $Al_{0.65}Ga_{0.35}As$ epitaxial layer 8 of 10 μm thickness was formed on this substrate 7 by liquid phase epitaxy. Uniformity of the thickness of the as-formed epitaxial layer 8 was within ±3% in the wafer plane and between such wafers. The surface 8' of the epitaxial layer 8 was in an excellent state with no abnormal growth etc.

In the aforementioned four Examples, it was recognized that the substrates for epitaxial growing AlGaAs may have somewhat rougher surfaces as compared with those for growing GaAs, conceivably because of the property that a growth surface of AlGaAs is easy to flatten as compared with GaAs.

COMPARATIVE EXPERIMENTAL EXAMPLE 1

Figure 2:
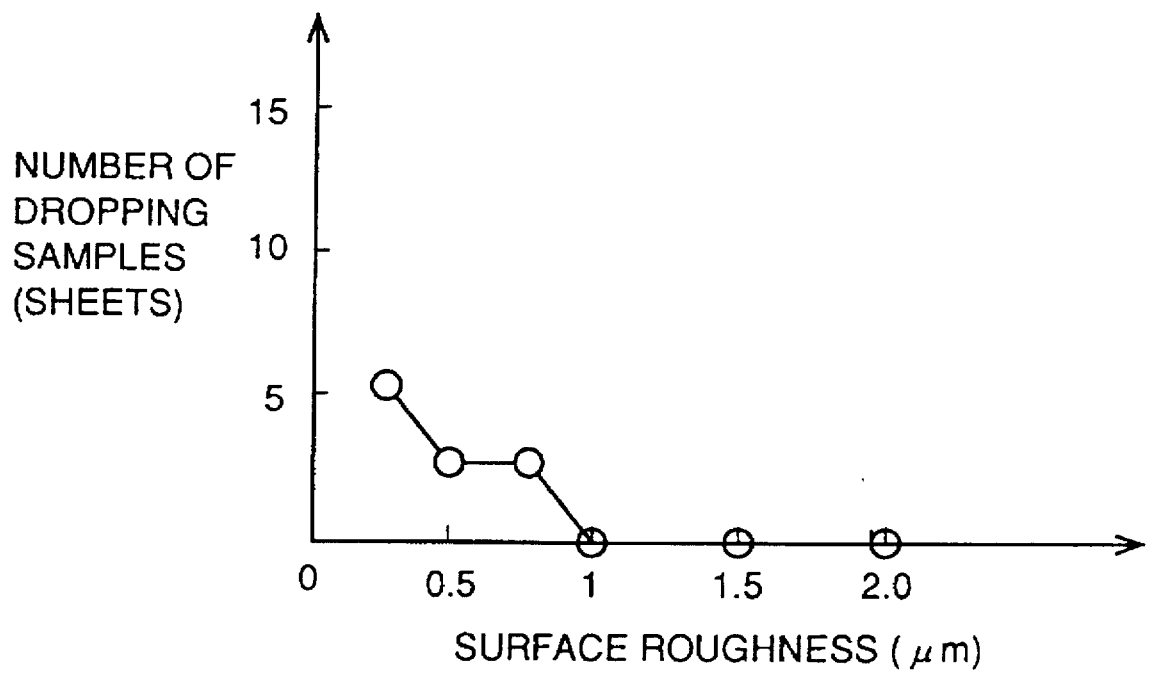
FIG. 2 is a graph showing the results of an experiment to determine numbers of dropping samples relative to the surface roughness of the substrate samples.

Various types of wafers having a surface roughness of not more than 2 μm were subjected to examination of numbers of those wafers dropping from a holding tool during transportation. For each of six types of wafers having surface roughness levels of 0.2 µm to 2 µm, 1000 samples were held with a pincette having forward ends of resin and were then transported white being held. FIG. 2 shows the results As shown in FIG. 2, 3 to 6 samples dropped in each group of wafers of less than 1 µm surface roughness, while no sample dropped in each group wafers of at least 1 µm surface roughness.

COMPARATIVE EXPERIMENTAL EXAMPLE 2

Figure 3:
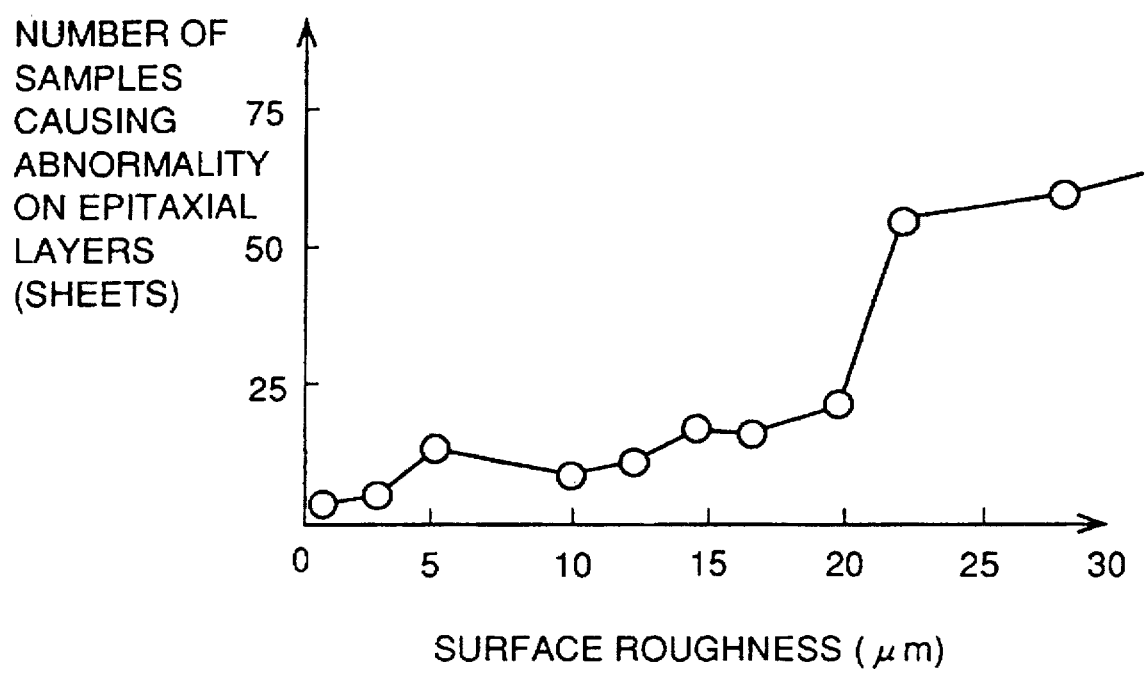
FIG. 3 is a graph showing a relation between the surface roughness levels of substrates and the numbers of samples causing an abnormality on surfaces of epitaxial layers formed on the substrates.

Various types of wafers of having a surface roughness of 1 um to 30 um were employed as substrates for growing GaAs epitaxial layers about 20 µm in thickness 100 samples were prepared for each of 10 types of wafers having surface roughness levels of 1 µm to 30 µm, to examine the relation between the surface roughness levels of the substrates and the rate or degree of occurrence of surface abnormality in the as-grown epitaxial layers. FIG. 3 shows the results. As shown in FIG. 3, the wafers of not more than 20 µm surface roughness exhibited an infrequent occurrence of abnormalities on the surfaces of the epitaxial layers, while the occurrence of such abnormalities abruptly increased when the surface roughness exceeded 20 µm. The occurrence of abnormalities was particularly small in a range of surface roughness of at least 1 µm and not more than 10 µm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of making a semiconductor element comprising:

a) forming a single-crystalline compound semiconductor substrate;

b) preparing the substrate to have at least one rough surface having an average surface roughness within a range from 1 µm to 20 µm inclusive for reducing a risk of said substrate slipping in following step c);

c) holding said substrate in a holding tool; and d) forming an epitaxial semiconductor layer on the rough surface of the substrate by liquid phase epitaxy.

2. The method of claim 1, wherein the average surface roughness is an average of a plurality of roughness values measured respectively at a plurality of measurement areas each having an area of about 1 cm² on the rough surface, wherein each roughness value is a difference between a maximum surface height and a minimum surface height along a 1 mm long line within a respective one of the measurement areas, and wherein at least 50% of the roughness values are within a range from 1 µmm to 20 µm inclusive.

3. The method of claim 1, further comprising partially melting the rough surface before said step of forming an epitaxial layer.

4. The method of claim 3, wherein said partial melting comprises partially dissolving the rough surface in a solution of a raw material of the substrate.

5. The method of claim 1, further expressly excluding all lapping and polishing processes on the substrate prior to said step of forming an epitaxial layer.

6. The method of claim 1, wherein said steps of forming a substrate and preparing the substrate to have at least one rough surface together comprise slicing a substrate wafer from a single-crystalline ingot using a slicer.

7. The method of claim 6, further comprising a preliminary step of preparing the slicer by electrodepositing diamond abrasive grains on a grindstone.

8. The method of claim 1, wherein the substrate is prepared so that the rough surface has an average surface roughness within a range from 1 µm to 10 µm inclusive.

9. The method of claim 1, wherein the substrate is prepared so that the rough surface has an average surface roughness within a range from 2.0 µm to 20 µm inclusive.

10. The method of claim 1, wherein the substrate has a thickness in the range from about 370 µm to about 600 µm.

11. The method of claim 1, wherein said step of forming the epitaxial semiconductor layer is carried out so that the epitaxial layer has an n-type semiconductor layer and a p-type semiconductor layer.

12. The method of claim 1, wherein said step of forming the epitaxial layer is carried out so that the epitaxial layer has a thickness in the range from about 10 µm to about 180 µm, with a variation of the thickness being less than about ±5%.

13. The method of claim 1, wherein the epitaxial layer has an epitaxial growth start surface adjacent the rough surface and an epitaxial growth end surface opposite the growth start surface, and wherein the growth end surface is substantially smooth compared to the average surface roughness of the rough surface of the substrate.

14. The method of claim 1, wherein said step of forming a substrate comprises forming an intrinsic semiconductor material wafer, and said step of forming an epitaxial layer comprises forming a doped semiconductor layer.

15. The method of claim 1, wherein said step of forming a substrate comprises forming an intrinsic GaAs wafer, and said step of forming an epitaxial layer comprises forming a doped GaAs layer.

16. The method of claim 1, wherein said step of forming a substrate comprises forming a Zn-doped GaAs wafer, and said step of forming an epitaxial layer comprises forming an AlGaAs layer.

17. The method of claim 1, wherein the epitaxial layer has an epitaxial growth start surface adjacent the rough surface and an epitaxial growth end surface opposite the growth start surface, and wherein the growth end surface is smoother than the average surface roughness of the rough surface of the substrate.

18. A method of making a semiconductor element comprising:

a) forming a single-crystalline compound semiconductor substrate;

b) preparing the substrate to have at least one rough surface having an average surface roughness within a range from 2.0 µm to 20 µm inclusive for reducing a risk of said substrate slipping in following step c), wherein the average surface roughness is an average of a plurality of roughness values measured respectively at a plurality of measurement areas each having an area of about 1 cm² on the rough surface, wherein each roughness value is a difference between a maximum surface height and a minimum surface height along a 1 mm long line within a respective one of the measurement areas, and wherein at least 50% of the roughness values are within a range from 2.0 µm to 20 µm inclusive;

c) holding said substrate in a holding tool; and d) forming an epitaxial semiconductor layer on the rough surface of the substrate by liquid phase epitaxy.

19. A method of making a semiconductor element comprising:

a) forming a single-crystalline compound semiconductor substrate;

b) preparing the substrate to have at least one rough surface having an average surface roughness within a range from 1 μm to 10 μm inclusive for reducing a risk of said substrate slipping in following step c), wherein the average surface roughness is an average of a plurality of roughness values measured respectively at a plurality of measurement areas each having an area of about 1 cm² on the rough surface, wherein each roughness value is a difference between a maximum surface height and a minimum surface height along a 1 mm long line within a respective one of the measurement areas, and wherein at least 50% of the roughness values are within a range from 1 μm to 10 μm inclusive;

c) holding said substrate in a holding tool; and d) forming an epitaxial semiconductor layer on the rough surface of the substrate by liquid phase epitaxy.

\* \* \* \* \*

UNITED STATES PATENT AND TRADEMARK OFFICE
CERTIFICATE OF CORRECTION

PATENT NO. : 5,639,299
DATED : June 17, 1997
INVENTOR(S) : Inoue et al.

It is certified that error appears in the above-identified patent and that said Letters Patent is hereby corrected as shown below.

```
Col. 1, line 21, after "art" insert --,--.
Col. 2, line  1, delete "in" (first occurrence), after "one" (second
                 occurrence) insert --in--.
Col. 3, line  3, delete "and";
        line 40, replace "area" by --areas--;
        line 47, after "substrate" insert --1--;
        line 49, replace "layers," by --layers--;
        line 65, after "method" insert --,--.
Col. 4, line 10, replace "of" by --or--;
        line 19, replace "in" by --It--;
        line 20, after "surface 3" insert --,--;
        line 21, replace "surface 3" by --surface 3'--;
        line 34, after "1 cm²" insert --,--;
        line 36, replace "area" by --areas--;
        line 37, after "Fig. 6" insert --,--;
        line 51, replace "area" by --areas--;
        line 52, after "Fig. 7," insert --an--.
Col. 5, line 12, replace "um" (both instances) by --μm--.
```

Signed and Sealed this

Twenty-third Day of September, 1997

Attest:

BRUCE LEHMAN

*Attesting Officer*   Commissioner of Patents and Trademarks